United States Patent
Yabata

(10) Patent No.: US 11,424,238 B2
(45) Date of Patent: Aug. 23, 2022

(54) SEMICONDUCTOR DEVICE AND SEMICONDUCTOR DEVICE FABRICATION METHOD

(71) Applicant: LAPIS SEMICONDUCTOR CO., LTD., Kanagawa (JP)

(72) Inventor: Atsushi Yabata, Kanagawa (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 0 days.

(21) Appl. No.: 17/026,550

(22) Filed: Sep. 21, 2020

(65) Prior Publication Data

US 2021/0098443 A1 Apr. 1, 2021

(30) Foreign Application Priority Data

Sep. 27, 2019 (JP) .............................. JP2019-177472

(51) Int. Cl.
*H01L 27/02* (2006.01)
*H01L 21/266* (2006.01)
*H01L 29/32* (2006.01)
*H01L 23/00* (2006.01)

(52) U.S. Cl.
CPC ........ *H01L 27/0207* (2013.01); *H01L 21/266* (2013.01); *H01L 23/562* (2013.01); *H01L 29/32* (2013.01)

(58) Field of Classification Search
None
See application file for complete search history.

(56) References Cited

U.S. PATENT DOCUMENTS

| | | | | |
|---|---|---|---|---|
| 2007/0018251 A1* | 1/2007 | Hirase | ................. | H01L 29/7845 257/368 |
| 2009/0146310 A1* | 6/2009 | Ohno | ................. | H01L 21/2686 257/773 |
| 2021/0273074 A1* | 9/2021 | Erhu | ................. | H01L 29/6681 |

FOREIGN PATENT DOCUMENTS

JP 2009-141075 A 6/2009

* cited by examiner

*Primary Examiner* — Bo B Jang
(74) *Attorney, Agent, or Firm* — Volentine, Whitt & Francos, PLLC

(57) ABSTRACT

A semiconductor device is provided with circuit patterns and dummy patterns. The circuit patterns facilitate circuit operations and the dummy patterns do not facilitate circuit operations. The dummy patterns are formed as patterns at which crystal defects are more likely to be caused by stress than the circuit patterns.

6 Claims, 4 Drawing Sheets

<1>  <2>

Prior Art

SEMICONDUCTOR DEVICE AND SEMICONDUCTOR DEVICE FABRICATION METHOD

CROSS-REFERENCE TO RELATED APPLICATION

This application is based on and claims priority under 35 USC 119 from Japanese Patent Application No. 2019-177472 filed on Sep. 27, 2019, the disclosure of which is incorporated by reference herein.

BACKGROUND

Technical Field

The present disclosure relates to a semiconductor device and to a fabrication method of the semiconductor device.

Related Art

Japanese Patent Application Laid-Open (JP-A) No. 2009-141075 is known as an example of a reference relating to crystal defects in semiconductor devices. JP-A No. 2009-141075 discloses a semiconductor device subjected to a light annealing process by illuminated light with a principal wavelength of 1.5 μm or less. The semiconductor device is provided with a circuit pattern region and a dummy pattern region formed on a semiconductor substrate. The circuit pattern region includes integrated circuit patterns that facilitate circuit operations, and the dummy pattern region includes dummy gate patterns that do not facilitate circuit operations. The dummy gate patterns are formed on the substrate at distances from the circuit pattern region and include structures similar to gate patterns used in the integrated circuit patterns. In the dummy pattern region, the dummy gate patterns are arranged periodically with a pitch of no more than 0.4 times the principal wavelength. In JP-A No. 2009-141075, temperature variability on the semiconductor substrate that occurs in the light annealing process may cause thermal stresses, which may lead to crystal defects and the like, and circuit performance may be degraded.

An example of a dummy pattern provided at a semiconductor device is described with reference to a semiconductor device 50 according to a comparative example that is shown in FIG. 4A to FIG. 4C. The semiconductor device 50 is a logic circuit that uses, as an example of element isolation, shallow trench isolation (STI).

As shown in FIG. 4A, the semiconductor device 50 is provided with a dummy region 51 and a circuit region 52. The dummy region 51 is a region in which patterns that are dummies for predetermined purposes (dummy patterns) are disposed, and the circuit region 52 is a region in which patterns of circuit elements that implement functions of the semiconductor device 50 (circuit patterns) are disposed. FIG. 4B shows an example of dummy patterns 60. In FIG. 4B, each dummy pattern 60 illustrates a pattern of a semiconductor region; STI is formed around the dummy pattern 60. FIG. 4C shows examples of circuit patterns 61. In FIG. 4C, each circuit pattern 61 illustrates a pattern of a semiconductor region; STI is formed around the circuit pattern 61. As can be seen by comparing FIG. 4B with FIG. 4C, the dummy patterns 60 are mostly formed as relatively simple patterns compared to the circuit patterns 61.

In a semiconductor device, a circuit pattern (an active region pattern) employed in a circuit region (for example, a logic circuit region) is generally asymmetric, as illustrated in FIG. 4C, and often has a large number of corners (vertex portions) and is laid out in a complex pattern. The more complex the shape of a layout pattern, the more likely stress differences are to occur between semiconductor regions (for example, silicon) and embedded oxide layer regions in, for example, a high-temperature heat treatment process, and the more likely crystal defects are to be caused by local stresses.

Dummy patterns can be provided in order to suppress dishing in, for example, a trench formation process, chemical mechanical polishing (CMP) process or the like. The term "dishing" refers to the phenomenon of a metal such as a wiring material or the like being excessively removed, to or beyond the surface of a surrounding insulator layer. Because these dummy patterns are not subject to circuit design constraints, the dummy patterns are generally symmetrical as illustrated in FIG. 4B, and usually have few corners and are formed in simple patterns. As a result, a characteristic of the dummy patterns is that local stresses are less likely to occur and crystal defects are less likely to occur at layout patterns of dummy patterns than at layout patterns of circuit patterns.

In the semiconductor device 50, the dummy patterns 60 and circuit patterns 61 with the respective characteristics described above are mixed together. When a heat treatment is applied to the semiconductor device 50 in this state, while the temperature is rising to a specified temperature, crystal defects B occur at the circuit patterns 61 earlier than at the dummy patterns 60. Hence, circuits may not operate due to leakages caused by the crystal defects B. That is, in the semiconductor device 50 according to the comparative example, because the circuit region has patterns that are more susceptible to crystal defects than the dummy region, crystal defects occur in the circuit patterns earlier than in the dummy patterns when a heat treatment is applied.

SUMMARY

In consideration of the circumstances described above, embodiments of the present invention relate to the provision of a semiconductor device and a semiconductor device fabrication method that restrain crystal defects.

In order to achieve the object described above, a semiconductor device according to an aspect of the present invention includes: a circuit pattern that facilitates circuit operations; and a dummy pattern that does not facilitate circuit operations, wherein the dummy pattern is a pattern at which crystal defects are more likely to be caused by stress than the circuit pattern.

In order to achieve the object described above, a semiconductor device according to another aspect of the present invention includes: a circuit pattern that facilitates circuit operations; and a dummy pattern that does not facilitate circuit operations, wherein an ion implantation amount in the dummy pattern is greater than an ion implantation amount in the circuit pattern.

In order to achieve the object described above, a semiconductor device fabrication method according to an aspect of the present invention includes: on a semiconductor substrate, forming a circuit pattern that is to facilitate circuit operations and a dummy pattern that is not to facilitate circuit operations; and implanting ions into the dummy pattern without implanting ions into the circuit pattern.

According to embodiments of the present invention, an effect is provided in that a semiconductor device and semiconductor device fabrication method that restrain crystal defects may be provided.

DETAILED DESCRIPTION

Below, exemplary embodiments of the present disclosure are described in detail with reference to the attached drawings. For the semiconductor devices and semiconductor device fabrication method described below, modes that employ STI as an element isolation structure are described as examples. However, element isolation structures according to the present disclosure are not limited to STI; for example, local oxidation of silicon (LOCOS) or the like may be employed.

First Exemplary Embodiment

Figure 1A:
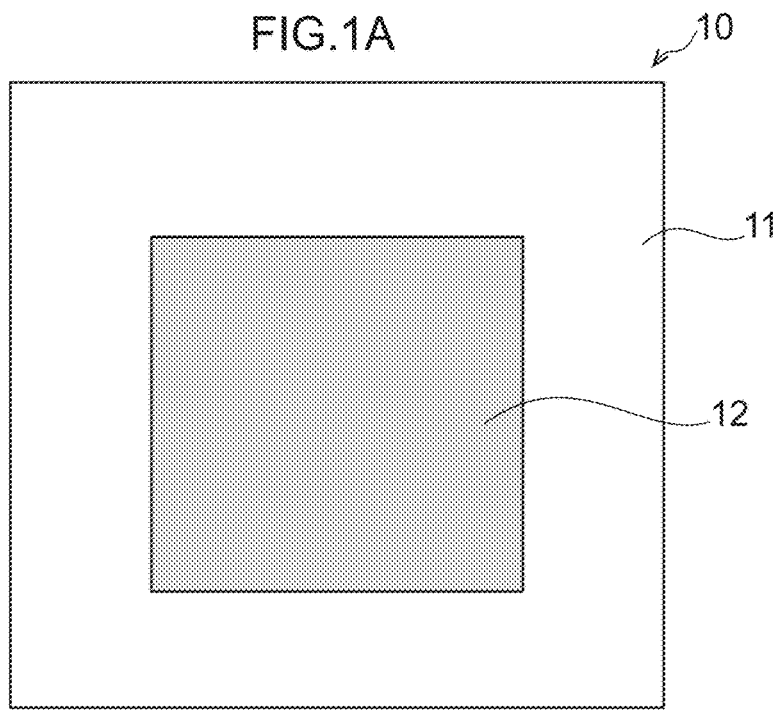
FIG. 1A is a plan view showing an example of overall structure of a semiconductor device according to a first exemplary embodiment.

A semiconductor device 10 according to the present exemplary embodiment is described with reference to FIG. 1A to FIG. 1C. As shown in FIG. 1A, the semiconductor device 10 is provided with a dummy region 11 and a circuit region 12. The dummy region 11 is a region in which dummy patterns are disposed in accordance with objectives. The circuit region 12 is a region in which circuit patterns that administer circuit functions of the semiconductor device 10 are disposed. Dummy patterns are provided for various purposes in semiconductor devices. In the present exemplary embodiment, as an example, the dummy patterns are provided to suppress dishing in a CMP process and the like.

In the semiconductor device 10 according to the present exemplary embodiment, the dummy region 11 is disposed so as to surround the circuit region 12. However, disposition relationships of the dummy region 11 and the circuit region 12 are not limited thus; various arrangements are possible in accordance with layout conditions and the like. Crystal defects occurring in the dummy region 11 do not directly affect circuit functions of the semiconductor device 10. Therefore, when the occurrence of crystal defects is anticipated from conditions such as, for example, the layer structure of the semiconductor device 10, layer thicknesses and the like, it is hoped that failures of the semiconductor device 10 may be suppressed if conditions can be controlled such that the crystal defects occur in the dummy region 11.

Figure 4A:
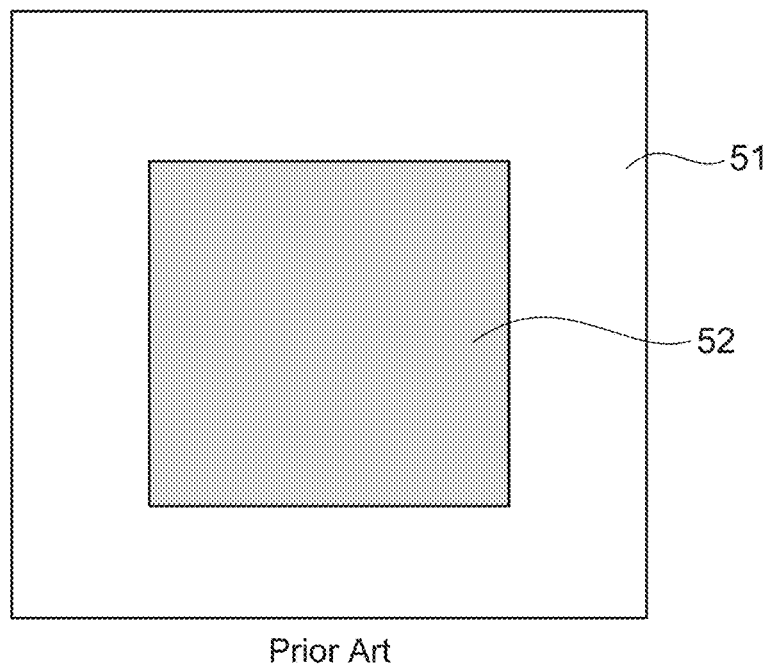
FIG. 4A is a plan view showing overall structure of a semiconductor device according to a comparative example.
Figure 4B:
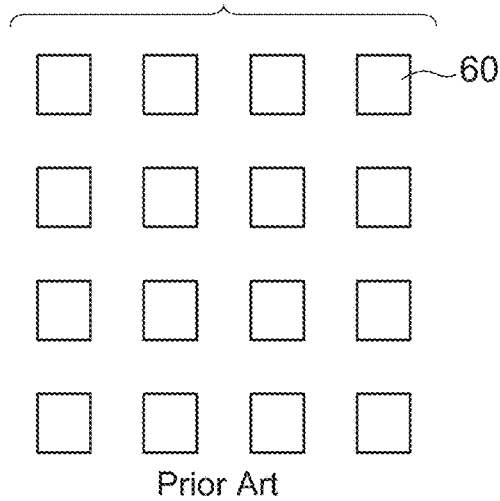
FIG. 4B is a plan view showing dummy patterns of the semiconductor device according to the comparative example.
Figure 4C:
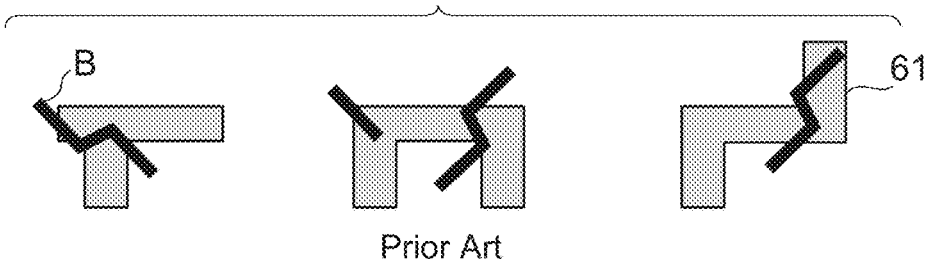
FIG. 4C is a plan view showing circuit patterns of the semiconductor device according to the comparative example.

For both dummy patterns and circuit patterns, the more complex a layout pattern, the more susceptible to crystal defects a region in which the layout pattern is formed tends to be. In the present exemplary embodiment, the meaning of the term "complex layout pattern" is intended to include an "asymmetric" layout pattern or a pattern with a large "corner count", which are described below. That is, at a simple, isotropic pattern as illustrated in FIG. 4B, stresses are likely to disperse and the probability of crystal defects occurring is likely to be low. In contrast, at a layout pattern that is complex and has directional dependency as illustrated in FIG. 4C, stresses are less likely to disperse but accumulate in particular areas, and the probability of stresses resulting in crystal defects is likely to be high. The present exemplary embodiment is based on this understanding.

Figure 1B:
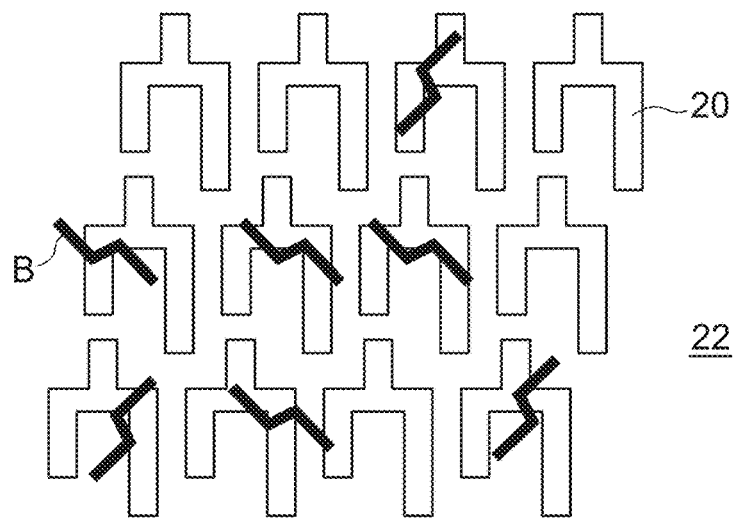
FIG. 1B is a plan view showing an example of dummy patterns of the semiconductor device according to the first exemplary embodiment.
Figure 1C:
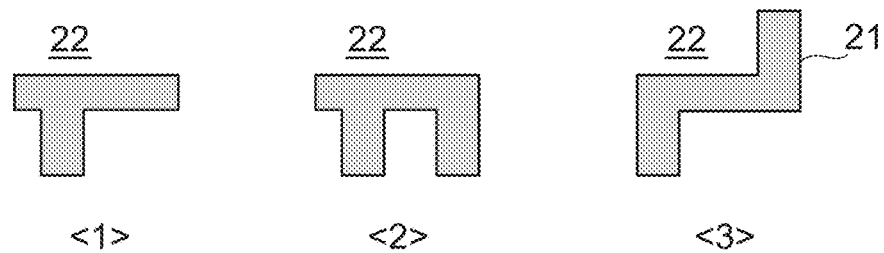
FIG. 1C is a plan view showing examples of circuit patterns of the semiconductor device according to the first exemplary embodiment.

FIG. 1C shows examples of circuit patterns 21 that are laid out in the circuit region 12. Each circuit pattern 21 is a pattern of the semiconductor region (for example, if the semiconductor device is silicon-based, an area of silicon). An STI region 22 is formed around the circuit pattern 21. The STI region 22 is a structure in which trenches are filled with an insulator (for example, if the semiconductor device is silicon-based, a silicon oxide layer ($SiO_2$)). That is, the circuit patterns 21 are structures whose surroundings are encircled by an insulator. As shown in FIG. 1C, the circuit patterns 21 are often asymmetric and many have a large number of corners (vertex portions). This is because the circuit patterns 21 must be laid out according to arbitrary patterns corresponding to factors such as arrangements of circuit elements and circuit blocks.

Figure 2A:
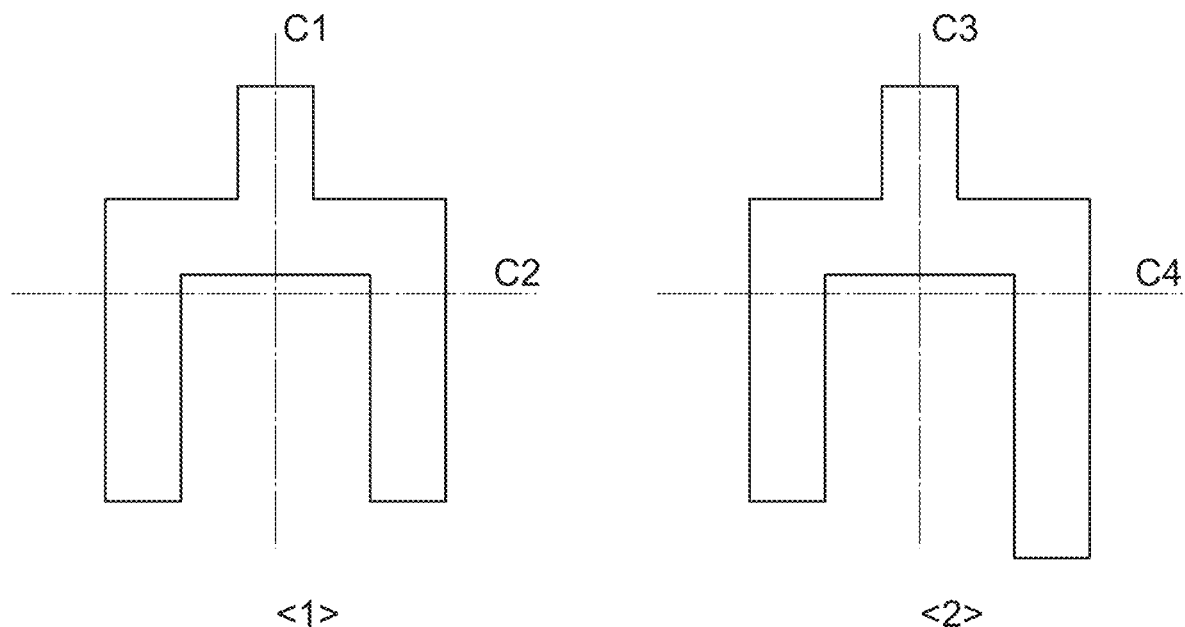
FIG. 2A is a diagram explaining a definition of symmetry in semiconductor devices according to the exemplary embodiments.
Figure 2B:
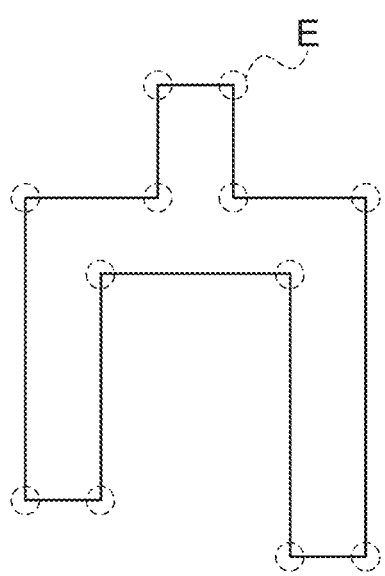
FIG. 2B is a diagram explaining corners in the semiconductor devices according to the exemplary embodiments.

Now, "symmetry" and "corners" of layout patterns according to the present exemplary embodiment are described with reference to FIG. 2A and FIG. 2B. First, symmetry in the present exemplary embodiment is principally understood to mean reflection symmetry. That is, in FIG. 2A, the layout pattern marked <1> is symmetric and the layout pattern marked <2> is asymmetric. The layout pattern marked <1> in FIG. 2A is not symmetric about axis C2 but is symmetric about axis C1. In the present exemplary embodiment, when there is an axis of reflection symmetry as in layout pattern <1> of FIG. 2A, this is considered symmetric. By contrast, in the layout pattern marked <2> in FIG. 2A, neither axis C3 nor axis C4 constitutes an axis of reflection symmetry, and there are no likely alternative axes of symmetry. In the present exemplary embodiment, when there is no axis of symmetry, as in layout pattern <2> in FIG. 2A, this is considered asymmetric.

Now, corners are described. The term "corners" according to the present exemplary embodiment refers to vertex portions in a layout pattern, as indicated by the symbol E in FIG. 2B. The number of vertex portions in a layout pattern is referred to as the "corner count" of the layout pattern. Thus, the corner count of the layout pattern shown in FIG. 2B is 12.

FIG. 1B shows an example of dummy patterns 20 that are disposed in the dummy region. Similarly to the circuit patterns 21, each dummy pattern 20 is a pattern of a semiconductor region. The dummy patterns 20 differ from the circuit patterns 21 in that no circuit elements are formed in the dummy patterns 20. As shown in FIG. 1B, the STI region 22 is formed around each dummy pattern 20.

Each dummy pattern 20 shown in FIG. 1B is formed as a pattern resembling the layout pattern marked <2> in FIG. 2A. Thus, the dummy pattern 20 is asymmetric with a corner count of 12. By contrast, the circuit patterns 21 marked <1>, <2> and <3> in FIG. 1C are asymmetric and have corner counts of, respectively, 8, 10 and 8. Thus, in the present exemplary embodiment, the corner counts of the dummy patterns 20 are greater than the corner counts of the circuit patterns 21.

As described above, the dummy patterns 20 according to the present exemplary embodiment are formed to be asymmetric and have greater corner counts than the circuit patterns. Consequently, in a heat treatment process, crystal defects may occur at the dummy patterns 20 at lower temperatures than at the circuit patterns 21. That is, local stresses act on the dummy patterns 20 and produce crystal defects B. When the crystal defects B occur at the dummy patterns 20, stress can be dispersed. Therefore, even if a subsequent temperature of the heat treatment is higher, occurrences of crystal defects at the circuit patterns 21 are restrained.

In general, the circuit patterns 21 are asymmetric. Therefore, it is preferable if the dummy patterns 20 are both asymmetric and have greater corner counts than the circuit patterns 21. With regard to the possibility of crystal defects at the circuit patterns 21, it is preferable if the corner counts of the circuit patterns 21 are kept to, for example, 8 or less and, accordingly, it is preferable if the corner counts of the dummy patterns 20 are at least 12. In the present exemplary embodiment, an example of a mode is described in which the dummy patterns 20 are both asymmetric and have higher corner counts than the circuit patterns 21. However, depending on layout conditions of the semiconductor device 10 and the like, the dummy patterns 20 that are employed may be either asymmetric or have higher corner counts than the circuit patterns 21. According to investigations by the present inventors, corner counts have more effect on the production of crystal defects than asymmetry.

Second Exemplary Embodiment

A semiconductor device according to the present exemplary embodiment is a mode in which impurities are implanted into the dummy patterns 20. Accordingly, structures of the semiconductor device are similar to the semiconductor device 10 and descriptions thereof are not given. FIG. 1A to FIG. 1C are referred to when necessary.

For the semiconductor device according to the present exemplary embodiment, the circuit region 12 is masked and ions are selectively implanted into the dummy region 11. For the semiconductor device according to the present exemplary embodiment, another process separate from this implantation process is carried out to implant ions in the circuit region 12 in order to form circuit elements. It is preferable if doses (implantation amounts) of impurities are greater in the ion implantation into the dummy region 11 than in the ion implantation into the circuit region 12.

In ion implantation, atoms in a gaseous state are ionized, an electric field is applied to accelerate the ions, and these ions are forcibly injected into another material. Thus, damage may be caused to a semiconductor substrate subjected to ion implantation. This damage may be a factor in the production of crystal defects in the semiconductor substrate. Therefore, according to the semiconductor device according to the present exemplary embodiment, which is constituted with ion implantation amounts in the dummy region 11 that are greater than ion implantation amounts in the circuit region 12, the dummy region 11 is susceptible to crystal defects at lower temperatures in a heat treatment process than the circuit region 12.

When crystal defects occur in the dummy region 11, stress can be dispersed. Therefore, even when the temperature is subsequently raised, occurrences of crystal defects in the circuit region 12 are restrained.

Only the selective ion implantation into the dummy region 11 according to the present exemplary embodiment may be applied, or the selective ion implantation may be applied to the semiconductor device 10 according to the exemplary embodiment described above. When the present exemplary embodiment is applied to the semiconductor device 10, the intentional production of crystal defects in the dummy region 11 is easier than in the semiconductor device 10 according to the first exemplary embodiment.

The semiconductor device according to the present exemplary embodiment is fabricated as described below. A semiconductor substrate is prepared, and circuit patterns and dummy patterns are formed on the semiconductor substrate. The semiconductor substrate is silicon, gallium arsenide or the like, but is not particularly limited.

Then, photolithography or the like is used to form a mask pattern on the circuit region 12.

Then, using this mask pattern, ions are selectively implanted into the dummy region 11. Through the steps described above, the semiconductor device according to the present exemplary embodiment is fabricated.

Third Exemplary Embodiment

Figure 3A:
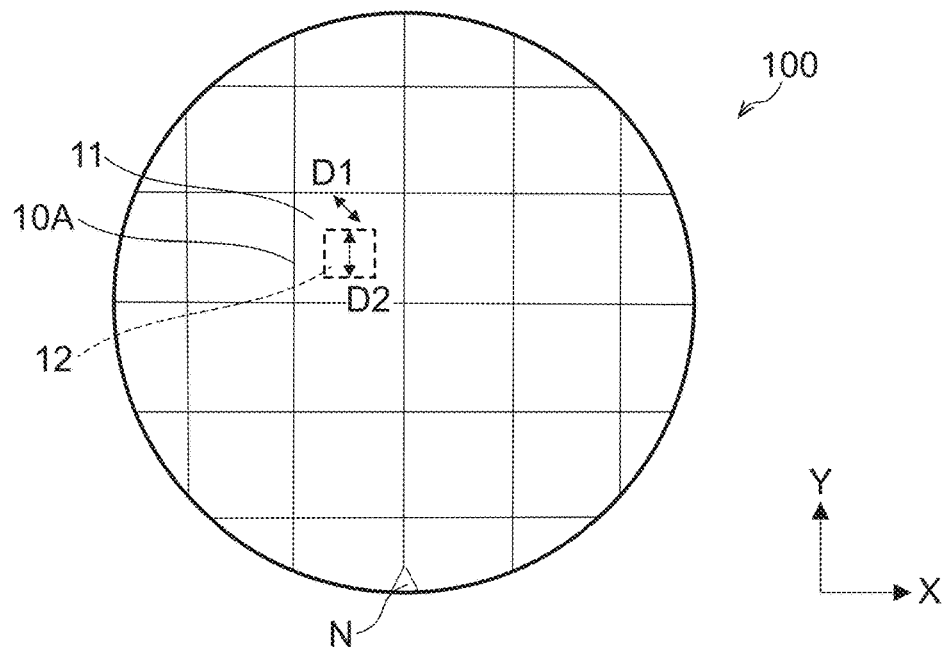
FIG. 3A is a plan view describing relationships between the layout direction of the semiconductor device according to the third exemplary embodiment and the crystal orientation of the semiconductor wafer.

A semiconductor device 10A according to the present exemplary embodiment is described with reference to FIG. 3A to FIG. 3C. The present exemplary embodiment is a mode in which a crystal orientation of layouts on a semiconductor wafer is altered between dummy patterns and circuit patterns. In the present exemplary embodiment, a silicon wafer is described as an example of the semiconductor wafer.

First, crystal orientations of the semiconductor wafer are described with reference to FIG. 3A. FIG. 3A shows a semiconductor wafer 100 on which a plural number of the semiconductor device 10A are formed. Each semiconductor device 10A is provided with the dummy region 11 and the circuit region 12. A notch N is provided at one location along the periphery of the semiconductor wafer 100. When the semiconductor wafer 100 is a silicon wafer, the direction of a diameter line passing through the notch N (that is, the Y-axis direction) is the direction of crystal plane (100). In the present disclosure, the direction of crystal plane indicated by notch N defines the crystal direction of the semiconductor wafer 100. When each semiconductor device 10A is substantially rectangular as illustrated in FIG. 3A, the semiconductor device 10A is generally arranged with sides thereof running along the X axis and the Y axis. The circuit patterns 21 laid out in the circuit region 12 are laid out in the direction of crystal plane (100), that is, the direction indicated by the symbol D2 in FIG. 3A. The meaning of the term "layout direction" as used herein is intended to include a direction that sides of the layout patterns constituting the circuit patterns 21 broadly run along. The circuit patterns 21 are laid out along the direction of crystal plane (100) because that direction is a direction of the silicon wafer in which crystal defects are less likely to occur. That is to say, if the circuit patterns 21 are laid out along another crystal orientation such as, for example, crystal plane (110), crystal defects are more likely to occur.

Heretofore, for reasons such as ease of layout, the dummy patterns 20 have been laid out along crystal plane (100), the same as the circuit patterns 21. In the present exemplary embodiment, in consideration of the ease of occurrence of crystal defects in a direction other than crystal plane (100) such as, for example, crystal plane (110), the dummy patterns 20 are laid out along the direction of crystal plane (110) (the direction indicated by the symbol D1 in FIG. 3A). Thus, the present exemplary embodiment is a mode in which crystal defects are more likely to occur at the dummy patterns 20 than at the circuit patterns 21. In this case, the layout direction of the circuit patterns 21 is the direction of crystal plane (100), the same as in convention. Therefore, a direction of warping of the silicon wafer is altered. Thus, for example, in a heat treatment process, the dummy patterns 20 are susceptible to crystal defects at lower temperatures than the circuit patterns 21. In the present exemplary embodiment, a mode in which the crystal orientation of the layout of the dummy pattern 20 is (110) is described as an example, but this is not limiting. Modes in which the layout direction is an alternative crystal orientation are possible provided the direction is a direction in which crystal defects are more likely to occur than crystal plane (100).

Figure 3B:
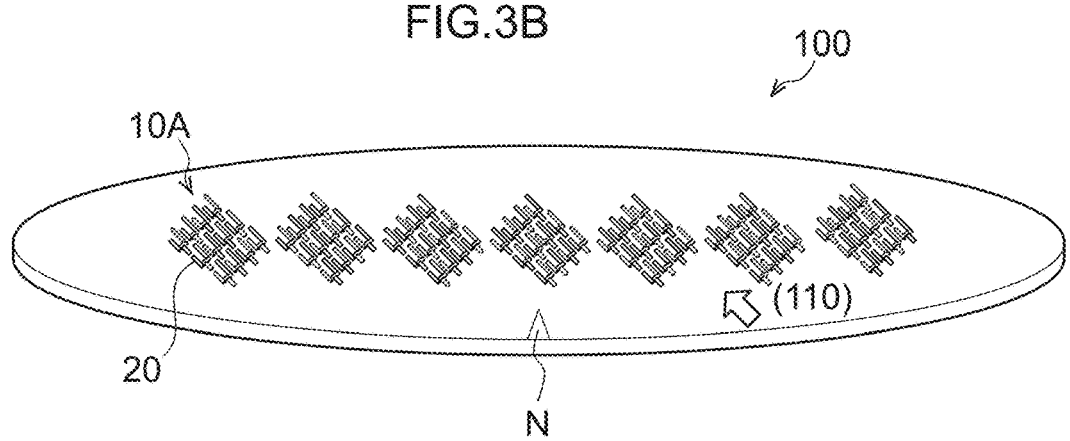
FIG. 3B is a perspective view showing an example of the relationship between the layout direction of dummy patterns of the semiconductor device according to the third exemplary embodiment and the crystal orientation of the semiconductor wafer.
Figure 3C:
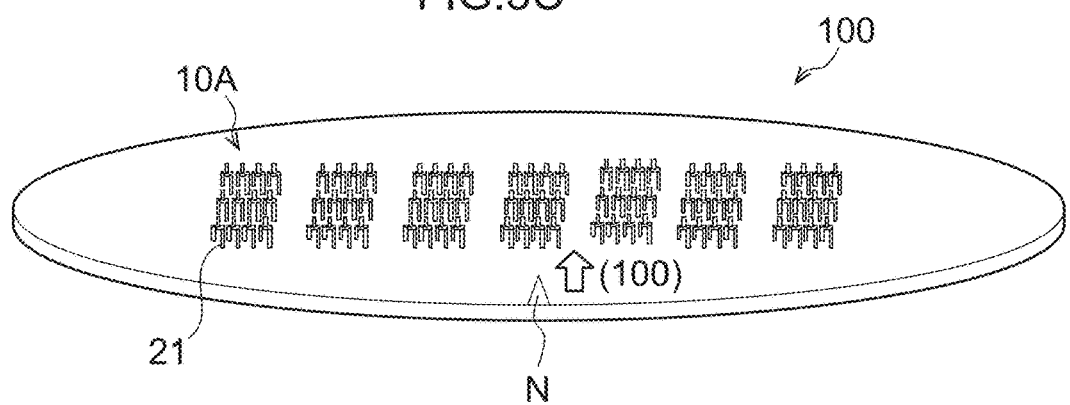
FIG. 3C is a perspective view showing another example of the relationship between the layout direction of circuit patterns of the semiconductor device according to the third exemplary embodiment and the crystal orientation of the semiconductor wafer.

FIG. 3B is a diagram schematically showing the layout direction (the direction of crystal plane (110)) of the dummy patterns 20 of the semiconductor devices 10A on the semiconductor wafer 100 relative to the notch N. FIG. 3C is a diagram schematically showing the layout direction (the direction of crystal plane (100)) of the circuit patterns 21 of the semiconductor devices 10A on the semiconductor wafer 100 relative to the notch N. Thus, in the present exemplary embodiment the crystal orientation of the layout of the dummy patterns 20 and the crystal orientation of the layout of the circuit patterns 21 differ by a pre-specified angle (45° in the present exemplary embodiment).

In the present exemplary embodiment, a mode is described as an example that only applies a structure in which the layout direction of the dummy patterns 20 and the layout direction of the circuit patterns 21 are made different.

Obviously, however, modes are possible that apply the present exemplary embodiment in combination with the first exemplary embodiment described above, the second exemplary embodiment, or both. When a combination with the exemplary embodiments described above is applied, crystal defects are more likely to occur at the dummy patterns 20.

In the exemplary embodiments described above, modes are described in which the symmetry of the layout patterns is principally understood to be reflection symmetry, but this is not limiting. Modes that take account of point symmetry (rotation symmetry) are also possible. That is, when crystal defects are likely to occur in a layout pattern with point symmetry, layout patterns with point symmetry may be employed as the layout patterns of dummy patterns.

What is claimed is:

1. A semiconductor device comprising:
a circuit pattern that facilitates circuit operations; and
a dummy pattern that does not facilitate circuit operations,
wherein the dummy pattern is a pattern at which crystal defects are more likely to be caused by stress than the circuit pattern, and
wherein the dummy pattern is formed with a greater number of corners than the circuit pattern.

2. The semiconductor device according to claim 1, wherein the dummy pattern is formed asymmetrically.

3. The semiconductor device according to claim 2, wherein an ion implantation amount in the dummy pattern is greater than an ion implantation amount in the circuit pattern.

4. The semiconductor device according to claim 1, wherein an ion implantation amount in the dummy pattern is greater than an ion implantation amount in the circuit pattern.

5. A semiconductor device comprising:
a circuit pattern that facilitates circuit operations; and
a dummy pattern that does not facilitate circuit operations,
wherein the dummy pattern is a pattern at which crystal defects are more likely to be caused by stress than the circuit pattern, and
wherein the dummy pattern is formed asymmetrically.

6. The semiconductor device according to claim 5, wherein an ion implantation amount in the dummy pattern is greater than an ion implantation amount in the circuit pattern.

* * * * *